April 23, 1974 F. J. BARONE 3,806,371

METHOD OF MAKING COMPLEMENTARY MONOLITHIC INSULATED GATE FIELD EFFECT TRANSISTORS HAVING LOW THRESHOLD VOLTAGE AND LOW LEAKAGE CURRENT

Filed July 28, 1971

INVENTOR.
Frank J. Barone

BY

Mueller & Aichele
ATTY'S.

3,806,371

METHOD OF MAKING COMPLEMENTARY MONOLITHIC INSULATED GATE FIELD EFFECT TRANSISTORS HAVING LOW THRESHOLD VOLTAGE AND LOW LEAKAGE CURRENT

Frank J. Barone, Tempe, Ariz., assignor to Motorola Inc., Franklin Park, Ill.

Filed July 28, 1971, Ser. No. 166,903
Int. Cl. H01l 7/34
U.S. Cl. 148—1.5 6 Claims

ABSTRACT OF THE DISCLOSURE

A method is disclosed for providing high quality, low threshold voltage, low leakage, complementary insulated gate field effect transistors in integrated form in which a gettering layer of phossil glass is deposited on the back of a wafer prior to gate oxidation. During gate oxidation a gettering action occurs which lowers leakage currents in the completed transistors. Immediately after gate oxidation is an annealing step in an inert ambient to lower the gating thresholds of the transistors. Two cleaning steps are also provided, one before gate oxidation and the other before metallization to improve transistor performance.

BACKGROUND

This invention relates to the method of making low leakage current, low gate threshold voltage, complementary, insulated gate field effect transistors, hereinafter IGFET's, in integrated or in monolithic form.

While IGFET's have many uses, an important use of a complementary pair thereof is a building block of logic circuits. As is hereinafter explained, the proper connection of a pair of complementary IGFET's results in a voltage inverter. Furthermore, voltage inverters can be connected to provide NOR gate circuits and NAND gate circuits and transmission gate circuits. Several of these gate circuits may be connected to provide flip-flops and other components of logic circuits. As is understood, if the transistors are of low quality, that is if they exhibit high leakage voltage, the logic circuits built up with them as components will not operate properly. Furthermore, if the several transistors have high gate threshold voltages, the voltage necessary to operate the logic circuits, even though they leak very little, is high.

In the prior art, the complementary, or C-IGFET's are made by diffusing a tub of P-type impurities into a portion of a N-type crystalline substrate. Then the P-type drains and sources are diffused in the remainder of the N-type substrate and the N-type drains and sources are diffused in the tub. The resultant IGFET's are then tested for leakage and for gate threshold voltage. If the leakage and the threshold voltages are within tolerance, the resultant devices are useable. However, the yield of useable C-IGFET's using prior art methods is low, whereby the cost of useable C-IGFET's is increased. Furthermore, the acceptable gate threshold voltage of known IGFET's is in the order of 3 to 4 volts. Although such IGFET's are useable, a lower gate threshold voltage is desirable so that lower operating voltages can be used in the circuits which include such IGFET's.

It is an object of this invention to provide a method of producing monolithic C-IGFET's exhibiting very low leakage currents.

It is another object of this invention to provide monolithic C-IGFET's exhibiting gate threshold voltages of about half that of known C-IGFET's.

It is still another object of this invention to provide a method of producing C-IGFET's in monolithic or integrated form with high yield.

SUMMARY

It is known to provide guard rings in the surface of a monocrystalline substrate to reduce surface leakage current. According to this invention leakage is further reduced by applying a gettering layer to the surface of the substrate opposite to the surface in which the IGFET's are diffused. For the purpose of still further reducing the leakage, the substrate is subject to cleaning steps. These cleaning steps involve immersing the substrate in hot chromic acid, washing it in deionized water, immersing it in an ammonium fluoride, hydrogen fluoride water solution, washing in extra pure deionized water and drying. The threshold voltage is decreased by reducing the bound charge under the gate insulation, produced while making the C-IGFET's, by annealing the C-IGFET's in an inert atmosphere. The resultant C-IGFET's exhibit very little leakage current and have a gate threshold voltage which is about half that of prior art C-IGFET's.

DESCRIPTION

This invention will be better understood upon reading the following description in connection with the accompanying drawing in which.

Figures 1, 2, 3:
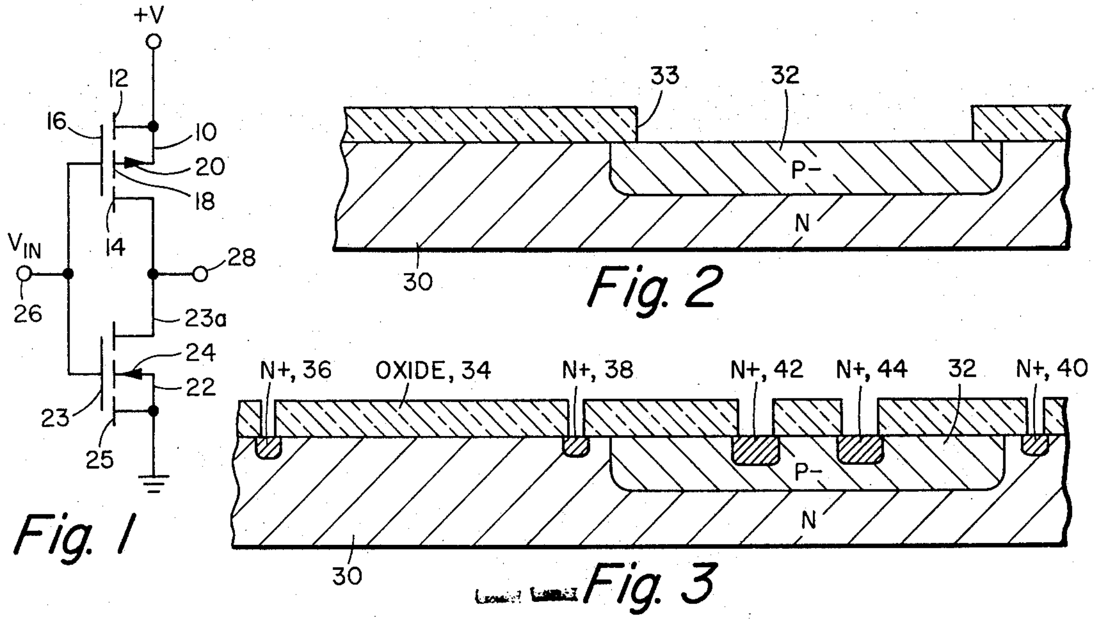
FIG. 1 illustrates one of the many uses of C-IGFET's.
FIG. 2 illustrates the steps of providing a tub of P-type material in an N-type substrate.
FIG. 3 illustrates the step of diffusing guard rings in the substrate but outside of the tub and of diffusing source and drain areas in the tub.
Figure 4:
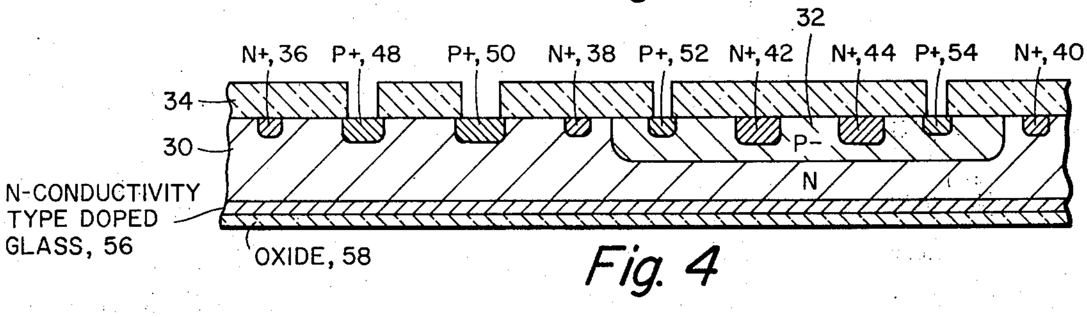
FIG. 4 illustrates the step of diffusion source and drain areas in the substrate but outside of the tub and of diffusing guard rings in the tube as well as the step of providing gettering layers for the substrate.

Turning first to FIG. 1, the P-channel or P-IGFET 10 has a drain electrode 14, a source electrode 12 and a gate electrode 16. The substrate, represented by the line 18 is shorted to the source 12. The arrow 20, which is directed away from the substrate 18, indicates that the transistor 10 is of the P-channel type. Application of an increasing negative voltage over the threshold voltage on the gate electrode 16 of the P-IGFET 10 causes increase of current flow between the drain 14 and source 12. The IGFET 22, which has a gate 23, as well as a substrate 24, a source 25 and a drain 23*a* is the N-channel of N-IGFET type, as is indicated by the direction of the arrow 24. The application of an increasing positive voltage over the threshold voltage to the gate of the IGFET 22 causes increasing current flow between the drain and the source of the IGFET 22. As noted, the drain 14 and source 12 of the transistor 10 are in series with the drain and source of the transistor 22. The gates to the two transistors 10 and 22 are connected in parallel and to an input terminal 26. If voltage on the input terminal 26 is zero, the transistor 10 is conducting and the transistor 22 is non-conducting. The voltage on the connection between the drain of the transistor 10 and the drain of the transistor 22, which is connected to the output terminal 28, is high. If the voltage on the input terminal 26 goes high in a positive direction, the transistor 10 becomes non-conductive and the transistor 22 becomes conductive and the voltage at the output terminal 28 is low. That is, the device of FIG. 1 is a high impedance voltage inverter drawing almost no current in its two extreme conditions of conductivity. The current drawn during change in conditions of conductivity is a function of the speed of operation, as well as the values of the load and of the parasitic capacitances of the C-IGFET's. If these two transistors and connections are put on a substrate, there is danger that leakage current will flow between the electrodes of the two transistors without control by the input voltage applied to the terminal 26, resulting in improper operation of the device. If the gate threshold voltage is high for the two transistors, the input terminal 26 is biased to this voltage and the voltage swing is imposed on this bias. Therefore, higher control voltages are required when high gate threshold voltage C-IGFET's are used than if low gate threshold voltage C-IGFET's are used. In addition, using C-IGFET's having high threshold voltages, the maximum frequency or speed of operation thereof is reduced, higher supply voltage is required and the standby leakage current is increased. A method of making a low leakage, low gate threshold voltage, integrated or monolithic, complementary IGFET is described in connection with FIGS. 2–6.

THE METHOD

The starting material as shown in FIG. 2 is a properly prepared N-conductivity type monocrystalline silicon wafer or substrate 30 having a resistance of about 4 to 6 ohm-centimeters. The wafer or substrate preparation comprises etching away about 10 microns of the surface thereof with a hydrochloric acid etch. This etching step removes possible work damage, caused while manufacturing the wafer. If the work damage is not removed, it causes excessive leakage currents in the final product. Then a layer of silicon oxide is provided on the upper surface, as viewed in FIG. 2, of the substrate 30. When the silicon oxide is formed through the thermal oxidation of the substrate 30, the oxide takes the form of $SiO_x$, where $x$ is a number from 1.7 to 3. Therefore the oxide layer is referred to as an oxide rather than $SiO_2$ which can also be used but is formed through chemical vapor deposition. A P tub 32 is diffused into the wafer 30 through a hole 33 in the oxide layer in a known manner. The tub 32 is about 10 microns deep. The density of P-conductivity type impurities in the tub 32 is in the range of 1 to $5\times10^6$ atoms per cubic centimeter, the material of the tub 32 having a slightly higher impurity concentration than the substrate 30. The original oxide layer is etched off and a layer 34 of oxide is provided on the top surface of the substrate 30. Then, as shown in FIG. 3, holes are etched in the oxide layer 34 and the substrate is subjected to N-impurity type diffusion. As a result of this diffusion, the $N^+$ guard rings 36, 38 and 40 are diffused into the N portion of the surface of the substrate 30 and $N^+$ regions 42 and 44, which are to be the source and drain of an N-IGFET, are produced in the surface of the tub 32. The wafer is then reoxidized filling up the previously etched holes.

Holes are then etched through the oxide layer 34 and the substrate 30 is subjected to a P-impurity type diffusion. As a result of this diffusion, the $P^+$ areas 48 and 50 are provided in the surface of the substrate 30 to become source and drain of a P-channel IGFET and the $P^+$ guard ring areas 52 and 54 are provided in the surface of the tub 32. Thereafter a composite etching step is performed which involves etching layer 34 above the locations for the gate oxide and above the places where contact is to be made to the elements in the substrate.

Up to this point the processing has been more or less conventional. The next step provides the aforementioned gettering material which in combination with the gate oxidation and annealing temperatures reduces leakage. At this time, as this next step, a layer 56 of phosphorous doped silicon oxide which is doped with impurities of N-conductivity type having large atoms, for example phossil glass, is deposited on the back of the substrate 30 as the gettering material. The phossil glass layer 56 has about $1\times10^{20}$ N-type or phosphorus atoms per cubic centimeter. The layer 56 is deposited at about 450° C. and is about 5,000 angstrom units thick. Then a capping layer 58 of pure silicon oxide about 2,000 angstrom units thick is deposited on the phossil glass 56 at about 450° C. The purpose of this capping layer is to prevent out-diffusion of the impurity atoms into the furnace as opposed to into the substrate to accomplish gettering. This depositing of the layers 56 and 58 does no damage to the upper working surface of the substrate 30 since at the temperature 450° C., the vapor pressure of the phosphorus in the layer 56 is low enough to prevent self- or auto-doping.

The substrate is then subjected to an important cleaning operation in order to remove impurities from the surfaces on which the gate oxide is to be grown. The desired low gate threshold is due at least in part to this cleaning treatment of the substrate. This cleaning treatment comprises first immersing the substrate 30 in its present state of completion in hot chromic acid at about 100° C. for about 10 minutes. Secondly, the substrate is rinsed in deionized water for about 5 minutes. Thirdly, the substrate is immersed in an etching solution comprising 15 parts by weight of ammonium fluoride, one part hydrogen fluoride and in four parts of deionized water for about ten seconds. Fourthly, the substrate is rinsed in extra pure deionized water for about fifteen minutes, and finally the substrate is blown dry with dry filtered nitrogen gas.

Figure 5:
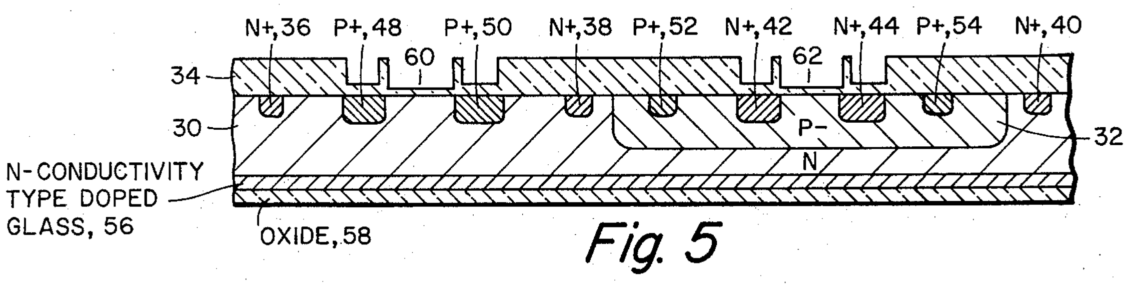
FIG. 5 illustrates the step of providing gate insulation.

Next is shown in FIG. 5 the oxide layer 60 between the source and drain 48 and 50, and the gate oxide layer 62 between the source and drain 42 and 44 are grown thermally at about 1115° C. to the thickness of about 1,000 angstrom units. The heat from this thermal process initiates the gettering action of the phossil glass which reduces the aforementioned current leakage in the completed device. The gate oxide layers 60 and 62 are grown in either a dry oxyegn atmosphere or in a wet oxygen atmosphere (oxygen that has been passed through water at 70° C.) The rate of oxidation or oxide growing step provides a high density of bound surface charge state under the gate insulation layers 60 and 62 at the interface of the gate insulation and the substrate 30. This bound surface charge, which may reach as much as $5\times10^{11}$ charges per square centimeter, greatly raises the gate threshold voltage of the several IGFET's.

This bound surface charge is reduce to about $1\times10^{10}$ charges per square centimeter by annealing the crystal at 1115° C. in an inert ambient atmosphere of nitrogen or argon for a period of not less than twice the time it takes to grow the gate oxides 60 and 62. It is this annealing step which lowers the gating threshold for the device. It will be appreciated that during this annealing step more getting occurs solely because of the presence of heat. Thus the gettering is produced by heating in any kind of an ambient while the lowering of the gate threshold is accomplished by annealing in an inert ambient. As noted above, the time of growing gate insulation depends on whether the gate insulation layers 60 and 62 were grown in dry or in wet oxygen. At the value of $1\times10^{10}$ charges per square centimeter, the bound charges have very little effect on the gate threshold voltage. The gate threshold voltage of the annealed transistors is about 1.3 to 2.2 volts for both the P- and the N-IGFET's. During these gate oxidation and annealing steps the N-conductivity type (in this case phosphorus) impurities of the phossil glass 56 are driven into the back of the monocrystalline substrate 30 as shown by $N^+$ region 90 of FIG. 6, inflicting, due to their large size, great strain and severely damaging it, causing severe lattice distortion to the crystal 30. The high stress energy of the area causes impurities, mostly heavy metals, such as copper and manganese to migrate down out of the upper portion of the crystal 30 where the transistor action takes place. The high strain energy of the highly stressed portion of the crystal 30 is relieved by this migration of the impurities. That is, the phosphorus diffused lower part 90 of the crystal 30 acts as a getter for impurities.

During the gate oxidation process the oxide layer 34 grows faster in empty hole regions and becomes thicker where it has not been cut away. The oxide therefore grows not only over the several channels but also in the bottom of the holes over the several sources and drains as shown in FIG. 5.

Figure 6:
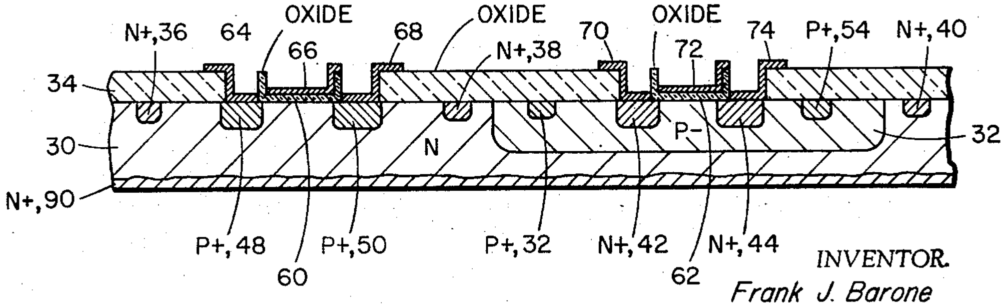
FIG. 6 illustrates the step of providing source, drain and gate metallization for the so-produced complementary insulated gate field effect transistors.

Then as shown in FIG. 6, the preohmic holes are cut through over the several sources and drains. At this step, the layers 56 and 58 are left unmasked and are thus etched off.

The gate layers 60 and 62 are carefully cleaned by the cleaning operation, described as above, which is here repeated so as to clean all surfaces for contact metallization. It cannot be emphasized too strongly that it is the above two cleaning steps which contribute so significantly to leakage and threshold reduction in combination with the gettering of the phossil glass layer and the annealing step. Contact metallization in the form of a conductor such as pure aluminum is then deposited on the source and drain regions and onto the gate insulator. This is usually done by hanging pieces of aluminum on a tungsten wire to evaporate the aluminum. However, it has been found that using tungsten for the source of heat may cause impurities such as sodium to be deposited on the crystal. The sodium gets into the gate insulators 60 and 62 resulting in unstable transistors. It has been found that a tantalum wire, used as a heat source for evaporating the aluminum, provides pure aluminum vapor, avoiding this cause of unstable transistors. The contact metallization is then patterned by etching off the aluminum from the substrate over regions where it is not wanted and the device is cleaned in the known standard manner. Then the device is passivated, that is, a layer of phossil glass is provided over the whole device. Since it is a known step, the passivation step is not illustrated in FIG. 6. Then the several conductive electrodes 64, 66, 68, 70, 72 and 74, usually aluminum are reached through holes etched in the passivating layer. The guard rings 36, 38, 40, 52 and 54, the gettering provided by the layer 56 when heated and the cleaning operations as disclosed thereabove, decrease the leakage in the produced C-IGFET's. The cleaning operations as noted above and the annealing decrease the gate threshold voltage for both of the N- and the P-IGFET's.

What is claimed is:

1. A method of making an insulated gate field-effect transistor having reduced leakage currents in a body of semiconductor of a first conductivity type having first and second major surfaces thereof comprising the steps of:

forming a source region and a drain region in said body of semiconductor at said first major surface;

forming a first oxide layer of said first conductivity type for gettering impurities from said body of semiconductor on said second major surface, said first oxide layer being relatively heavily doped;

forming a second oxide layer on said first oxide layer for preventing out-diffusion of impurities from said first oxide layer, said second oxide layer being essentially undoped; and thermally growing a gate oxide layer at relatively high temperatures on said first surface, whereby during said growing said first oxide layer acts to getter impurities from said body of semiconductor, effecting reduced leakage currents in said insulated gate field-effect transistor.

2. The method as recited in claim 1 wherein said body of semiconductor is silicon, and said first oxide layer is deposited phossil glass.

3. A method of making complementary monolithic insulated gate field-effect transistors having reduced leakage currents in a body of N-type silicon having first and second major surfaces thereof comprising the steps of:

forming a relatively lightly doped P-type tub region in said body of silicon at said first major surface;

forming an N-type source region and an N-type drain region in said P-type tub at said first major surface;

forming a P-type source region in a P-type drain region in said body of N-type silicon at said first major surface;

depositing a first oxide layer for gettering impurities from said body of silicon on said second major surface;

said first oxide layer being of said first conductivity type and being relatively heavily doped;

depositing a second capping oxide layer for preventing out-diffusion of impurities from said first oxide layer on said first oxide layer;

thermally growing third and fourth gate oxide regions on said first major surface between, respectively, said first and second N-type source and drain regions and said first and second P-type source and drain regions, said first oxide layer acting to getter impurities from said body of silicon during said thermal growing, effecting reduced leakage currents in said complementary monolithic insulated gate-field-effect transistors; and forming source, gate, and drain electrodes, respectively, on said first and second N- and P-type regions and said third and fourth gate oxide regions.

4. The method as recited in claim 3 wherein said first gate oxide is phossil glass with a doping concentration of approximately $1 \times 10^{20}$ atoms per cubic centimeter.

5. The method as recited in claim 3 wherein said first oxide layer is deposited at approximately 450° C., and is approximately 5000 angstrom units in thickness.

6. The method as recited in claim 3 further including the steps of forming an N-type guard ring in said body of silicon at said first major surface concurrently with said forming of said first N-type source region, and further forming a P-type guard ring in said P-type tub region at said first major surface concurrently with said forming of said first P-type source region.

References Cited

UNITED STATES PATENTS

| | | | |
|---|---|---|---|
| 3,579,815 | 5/1971 | Gentry | 148—175 X |
| 3,646,665 | 3/1972 | Kim | 148—187 X |
| 3,701,696 | 10/1972 | Mets | 148—187 X |

L. DEWAYNE RUTLEDGE, Primary Examiner

J. M. DAVIS, Assistant Examiner

U.S. Cl. X.R.

148—175, 187, 188; 317—235